US012656693B2

(12) United States Patent
Krone et al.

(10) Patent No.: US 12,656,693 B2
(45) Date of Patent: Jun. 16, 2026

(54) OPTICAL SYSTEM, LITHOGRAPHY APPARATUS AND METHOD

(71) Applicant: Carl Zeiss SMT GmbH, Oberkochen (DE)

(72) Inventors: Stefan Krone, Ellwangen (DE); Kai Kunze, Schwaebisch (DE); Sven Urban, Neu-Ulm (DE); Philipp Torres Da Silva, Grossbottwar (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 2 days.

(21) Appl. No.: 18/650,441

(22) Filed: Apr. 30, 2024

(65) Prior Publication Data

US 2024/0280916 A1 Aug. 22, 2024

Related U.S. Application Data

(63) Continuation of application No. PCT/EP2022/080108, filed on Oct. 27, 2022.

(30) Foreign Application Priority Data

Nov. 3, 2021 (DE) ..................... 10 2021 212 394.5

(51) Int. Cl.
G03F 7/20 (2006.01)
G02B 26/08 (2006.01)
G03F 7/00 (2006.01)

(52) U.S. Cl.
CPC ..... G03F 7/70808 (2013.01); G02B 26/0816 (2013.01); G03F 7/70033 (2013.01); G03F 7/70233 (2013.01)

(58) Field of Classification Search
CPC ............. G03F 7/70808; G03F 7/70033; G03F 7/70233; G03F 7/70508; G03F 7/70533;
(Continued)

(56) References Cited

U.S. PATENT DOCUMENTS 6,573,978 B1 6/2003 McGuire, Jr.
2006/0103908 A1 5/2006 Loopstra et al.
(Continued)

FOREIGN PATENT DOCUMENTS

DE 10 2008 009 600 A1 8/2009
DE 10 2016 225 901 A1 3/2017
(Continued)

OTHER PUBLICATIONS

Translation of International Search Report for corresponding PCT Appl No. PCT/EP2022/080108, dated Feb. 21, 2023.
(Continued)

*Primary Examiner* — Mesfin T Asfaw
(74) *Attorney, Agent, or Firm* — Fish & Richardson P.C.

(57) ABSTRACT

An optical system comprises: a plurality of optical components for guiding radiation in the optical system; a plurality of assemblies, each assembly comprising at least one actuator/sensor device assigned to one of the optical components; and a number of actuating units for actuating the plurality of assemblies. Each actuating unit is assigned at least two of the assemblies. An interface is provided for electrically coupling the respective actuating unit to the assemblies assigned to the actuating unit to transmit respective electrical signals between the actuating unit and the respective assemblies assigned to the actuating unit. The respective electrical signals comprise a data signal and/or electrical energy for operating the respective assembly. The interface for each assembly assigned to the actuating unit has a respective bundle of electrical cables.

19 Claims, 8 Drawing Sheets

(58) Field of Classification Search
CPC ............. G03F 7/70991; G03F 7/70075; G02B
26/0816; G02B 26/0833
See application file for complete search history.

(56)                     References Cited

U.S. PATENT DOCUMENTS

| | | | |
|---|---|---|---|
| 2006/0132747 | A1 | 6/2006 | Singer et al. |
| 2014/0055767 | A1* | 2/2014 | Waldis ................ G03F 7/70075 |
| | | | 359/846 |
| 2018/0074303 | A1 | 3/2018 | Schwab |
| 2019/0187574 | A1 | 6/2019 | Holz et al. |
| 2019/0346772 | A1* | 11/2019 | Holz ................... G03F 7/70491 |
| 2020/0272058 | A1 | 8/2020 | Bieling et al. |

FOREIGN PATENT DOCUMENTS

| | | |
|---|---|---|
| DE | 10 2017 220 586 A1 | 5/2019 |
| DE | 10 2015 224 742 B4 | 6/2020 |
| EP | 1 614 008 B1 | 1/2006 |
| WO | WO 2009/100856 A1 | 8/2009 |
| WO | WO 2018/041670 A1 | 3/2018 |

OTHER PUBLICATIONS

International Written Opinion in International Appln No. PCT/EP2022/080108, mailed on Feb. 21, 2023, 16 pages (with English translation).

\* cited by examiner

FLB

V+    V-    DATA0  DATA1

B1    L1
B2    L2
B3    L3
B4    L4

P    B1    N    B2

CB1- 4

B3    N    B4

OPTICAL SYSTEM, LITHOGRAPHY APPARATUS AND METHOD

CROSS-REFERENCE TO RELATED APPLICATIONS

The present application is a continuation of, and claims benefit under 35 USC 120 to, international application No. PCT/EP2022/080108, filed Oct. 27, 2022, which claims benefit under 35 USC 119 of German Application No. 10 2021 212 394.5, filed Nov. 3, 2021. The entire disclosure of each these applications is incorporated by reference herein.

FIELD

The present disclosure relates to an optical system, a lithography apparatus comprising such an optical system, and a method for producing such an optical system and a method for operating such an optical system.

BACKGROUND

Microlithography is used for producing microstructured components, for example integrated circuits. The microlithography process is carried out using a lithography apparatus, which has an illumination system and a projection system. The image of a mask (reticle) illuminated via the illumination system is projected here via the projection system onto a substrate, for example a silicon wafer, which is coated with a light-sensitive layer (photoresist) and arranged in the image plane of the projection system, in order to transfer the mask structure to the light-sensitive coating of the substrate.

Driven by the desire for ever smaller structures in the production of integrated circuits, EUV lithography apparatuses that use light with a wavelength in the range from 0.1 nm to 30 nm, such as 13.5 nm, are currently under development. Since most materials absorb light of this wavelength, it is generally desirable in such EUV lithography apparatuses to use reflective optics, which is to say mirrors, instead of—as previously—refractive optics, which is to say lens elements.

The mirrors may for example be secured to a supporting frame (force frame) and be configured to be at least partially manipulable or tiltable in order to allow a movement of a respective mirror in up to six degrees of freedom, and consequently a highly accurate positioning of the mirrors in relation to one another, for example in the pm range. This allows changes in the optical properties that occur for instance during the operation of the lithography apparatus, for example as a result of thermal influences, to be corrected.

For the purposes of moving the mirrors, for example in the six degrees of freedom, actuators which are controlled by way of a control loop are assigned to said mirrors. A device for monitoring the tilt angle of a respective mirror is provided as part of the control loop.

For example, WO 2009/100856 A1 discloses a facet mirror for a projection exposure apparatus of a lithography apparatus, which facet mirror has a multiplicity of individually displaceable individual mirrors. To ensure the optical quality of a projection exposure apparatus, very precise positioning of the displaceable individual mirrors is desirable.

For the purpose of positioning the displaceable individual mirrors, use is made of actuator devices for displacing the individual mirrors and sensor devices for ascertaining the positions of the individual mirrors.

A central control device arranged in the vacuum housing of the lithography apparatus is used for controlling the actuator devices and the sensor devices. A failure of this one central control device can cause a failure of the entire system. On account of the arrangement of the central control device in the vacuum housing of the lithography apparatus, the repair time in the case of such an individual fault can be relatively long.

DE 10 2015 224 742 B4 discloses an optical system comprising electronics which are set up in a treelike fashion and have a plurality of identical subsystems. A respective subsystem has a relatively limited functional scope, and so in the event of a failure of the subsystem, only the relevant part of the optical system is adversely affected. A subsystem is for example an individual actuator/sensor device, a driver circuit for controlling a plurality of actuator/sensor devices, or a control circuit for controlling a plurality of driver circuits. The optical system can thus continue to be operated despite the failure. The electronic set-up of the optical system may also be referred to as modular. For space reasons, interfaces between the hierarchical subsystems via which control signals, data and electrical power are transmitted are often embodied as common hardware. That is to say that a plurality of identical subsystems share a single interface, for example. This may have the effect that a fault in the interface may lead to the failure of a plurality of subsystems simultaneously.

SUMMARY

The present disclosure seeks to provide an improved optical system.

In an aspect, the disclosure provides an optical system is proposed, comprising:

a plurality of optical components for guiding radiation in the optical system, a plurality N1 of arrangements, where N1≥2, wherein each of the N1 arrangements comprises at least one actuator/sensor device assigned to one of the optical components, and a number N2 of control units for controlling the plurality N1 of arrangements, where N2≥1, wherein each of the N2 control units is assigned at least two of the N1 arrangements, and wherein provision is made of an interface for electrically coupling the respective control unit to the arrangements assigned to the control unit in order to transmit respective electrical signals between the control unit and the respective arrangements assigned to the control unit, wherein the respective electrical signals comprise a data signal and/or electrical energy for operating the respective arrangement, and wherein the interface has a respective bundle of electrical lines for each of the arrangements assigned to the control unit.

This optical system has modularity in the arrangements and control units which is also present at the interface level, i.e. the level of signal transmission between individual modules. For each arrangement, dedicated electrical lines via which the respective arrangement is connected to the control unit are thus present. Compared with conventional optical systems in which, for example, signal and/or operating voltage lines are shared by a plurality of arrangements (for example in a bus system), this means that in the event of a defect in a line, a plurality of arrangements are not affected by the defect, but rather only that arrangement in whose bundle of electrical lines the defect has occurred. It may also be stated that a dedicated bundle of electrical lines is provided for each arrangement. In the case of four assigned arrangements, for example, the interface thus also comprises four bundles of electrical lines embodied separately with respect to one another. If a defect occurs in one of the bundles, then this affects only the arrangement which is coupled to the control unit via the affected bundle.

The optical system thus provides that a defect in the signal transmission path provided by the interface does not paralyze the entire optical system with the resulting need for maintenance thereof, rather the optical system can continue to be operated with a partially restricted functional scope, for example, despite such a defect. An expensive outage and laborious maintenance of the optical system can thus be avoided.

The optical system is, for example, a multimirror system, such as a multimirror arrangement or a micromirror arrangement (MMA: micromirror array) or a lithography apparatus.

The arrangement having a number of actuator/sensor devices can also be referred to as a group of actuator/sensor devices.

The optical components can be for example mirrors, for example micromirrors, that is to say mirrors having a side length of less than 1 mm, or lens elements or optical gratings and/or filters. A respective optical component is displaceable, for example. A respective mirror or micromirror can be for example part of a multimirror arrangement or of a micromirror arrangement. Such an arrangement can comprise more than 100, such as than 1000, as an example more than 10,000, for example preferably more than 100,000, such mirrors. For example, these can be mirrors for reflecting EUV radiation.

The fact that the optical components are configured for guiding radiation in the optical system is understood to mean for example that the respective optical component is configured for manipulating the radiation, for example by deflecting or diverting the radiation via reflection or refraction. The respective optical component can also modify or influence other properties of the radiation, such as a polarization, a phase and/or a wavelength.

The optical system can be a projection optical unit of the projection exposure apparatus. However, the optical system can also be an illumination system. The projection exposure apparatus can be an EUV lithography apparatus. EUV stands for "extreme ultraviolet" and refers to a wavelength of the working light of between 0.1 nm and 30 nm. The projection exposure apparatus can also be a DUV lithography apparatus. DUV stands for "deep ultraviolet" and refers to a wavelength of the working light of between 30 nm and 250 nm.

The optical system can furthermore be part of a superordinate optical system, such as a beam shaping and illumination system of a lithography apparatus; for example, the optical system is embodied as an MMA module arranged in the beam shaping and illumination system. In this case, the optical system is arranged for example in an evacuable chamber or a vacuum housing.

The control unit can be implemented in hardware. If the implementation is in hardware, the control unit can be embodied as a device or as part of a device, for example as a computer or as a microprocessor or as a control computer or as an embedded system.

The interface for electrically coupling the control unit to the plurality of arrangements assigned to the control unit comprises a plurality of bundles of electrical lines. For example, a dedicated bundle is provided for each arrangement. A respective bundle of electrical lines comprises a plurality of electrical lines via which electrical signals can be transmitted from the control unit to the arrangement, or vice versa. The term electrical signals is understood here to mean digital or else analog electrical signals, wherein an operating voltage by way of which electrical energy is provided for the operation of the arrangement also constitutes an electrical signal. The electrical signal can comprise a data signal, which can comprise a control signal for controlling the arrangement, for example the actuator/sensor device, or else a measurement data signal from the actuator/sensor device.

The electrical signals are provided by the control unit individually for each of the arrangements and transmitted via the interface. Along the entire signal transmission path from the control unit to the respective arrangement, the electrical lines run separately, such that there is a strict separation of the electrical signals. The signal transmission in a first bundle thus remains uninfluenced by the signal transmission in a second bundle; for example, a defect in a specific bundle of electrical lines is restricted to the specific bundle and has no effect on further bundles.

The interface thus comprises any portion of the signal transmission path between the control unit and the respective arrangement. By way of example, if the control unit comprises a processor for determining individual control signals for the arrangements, then the signal transmission path begins at the processor, which outputs the individual control signals. In other words, the respective electrical line which transmits the respective control signal begins at the processor and from here runs separately from other electrical lines, even if the respective electrical line runs in portions on a circuit board of the control unit. Therefore, the interface does not just comprise a portion running from an output of the control unit as far as an input of a respective arrangement, but rather can additionally comprise portions within the control unit and/or the respective arrangement.

In accordance with an embodiment of the optical system, a respective bundle of electrical lines is configured for transmitting the electrical signals exclusively from the control unit to the arrangement coupled via the bundle.

In other words, via a specific bundle, it is only possible to transmit electrical signals to the arrangement coupled via the specific bundle.

In accordance with an embodiment of the optical system, the N1 arrangements have an identical construction and the bundles of the interface comprise an identical number of electrical lines for each of the arrangements assigned to the control unit.

The fact that the N1 arrangements have an identical construction is understood to mean that these are modules of identical design, for example having the same electrical and electronic components and interconnected in an identical way. Furthermore, each of the arrangements has an identical functional scope. Consequently, the control of each arrangement involves electrical signals of identical type, for example an identical operating voltage and control signals of identical type (which, however, can differ between the different arrangements by virtue of the respective information thereof). Therefore, each arrangement can be linked via an identical type of bundle of electrical lines, for example bundles having an identical number of electrical lines and an identical constitution, such as a cross-section and/or a loading limit, of the electrical lines. It may also be stated that each bundle comprises corresponding electrical lines.

It should be noted that, despite an identical construction, the arrangements can differ in terms of different settings, such as, for example, switch positions (jumper) or the like. Furthermore, a mechanical construction of the arrangements can be different; for example, a spatial arrangement of electrical or electronic components can be different.

In accordance with an embodiment of the optical system, a respective bundle of electrical lines comprises a number of operating voltage lines and a number of data signal lines.

The number of operating voltage lines can be two, three, four, or five, wherein the number depends on how many different voltages are used for operating the respective arrangement. The number can also be greater than five.

In accordance with an embodiment of the optical system, the interface comprises a printed circuit board having a plurality of separate electrical planes and the electrical lines of a respective bundle are embodied as conductor tracks on the printed circuit board, wherein the respective bundle of electrical lines is arranged in a respective plane.

The printed circuit board can be a printed circuit board of the control unit and/or of one of the arrangements. The printed circuit board can comprise a flexible printed circuit board in portions. The separate electrical planes can also be referred to as printed circuit board layers.

A dedicated printed circuit board layer can be assigned to each bundle. By way of example, the control unit is configured for controlling four arrangements. The interface then comprises four bundles of electrical lines running from the control unit to the respective arrangement. A printed circuit board of the control unit and/or a printed circuit board that integrates the four arrangements then comprises for example four printed circuit board layers for the four bundles of electrical lines.

The control unit and the arrangements can be arranged on a common printed circuit board.

In accordance with an embodiment of the optical system, the interface comprises a printed circuit board and the electrical lines of the respective bundle are embodied as conductor tracks on the printed circuit board, and wherein a distance between the conductor tracks of a first bundle with respect to the conductor tracks of a second bundle is greater than a distance between two conductor tracks within a bundle.

The distance between two conductor tracks of different bundles is for example at least double, such as triple, for example quadruple, five times and through to ten times the distance between two conductor tracks within a bundle. The greater the distance, the greater the degree of separation between the bundles, which reduces the probability of mutual influencing. However, the space used for the bundles on the printed circuit board increases as a result.

In accordance with an embodiment of the optical system, the interface has a separate plug connector for each arrangement assigned to the control unit, wherein the respective separate plug connector is configured for electrically connecting the number of electrical lines of the bundle between the control unit and the arrangement.

The plug connector comprises for example a plug and a socket, which are couplable to one another and can be disconnectable from one another.

By way of example, the control unit comprises, for each assigned arrangement, a plug (or a socket) configured for connecting to a socket (or a plug) of a connecting cable, which can be embodied as a flexible printed circuit board, wherein the connecting cable is coupled to the respective arrangement or is couplable thereto. The number of electrical lines that the connecting cable comprises is for example the same as the number of electrical lines that the respective plug connector has.

In accordance with an embodiment of the optical system, the interface has a common plug connector for a plurality of arrangements assigned to the control unit, for electrically connecting the electrical lines of the plurality of bundles between the control unit and the plurality of arrangements, wherein the common plug connector has a number K of contact pins, wherein K is greater than or equal to the sum of all the electrical lines comprised by the plurality of bundles, and wherein a distance between each two adjacent contact pins is greater than a length of a respective contact pin, and/or a pin allocation of the plug connector is such that an unallocated contact pin and/or a contact pin having a neutral reference potential is arranged between two contact pins to which electrical lines of different bundles are assigned.

In this embodiment, installation space on a circuit board of the control unit and/or a circuit board with a plurality of arrangements can be saved by comparison with separate plug connectors for each bundle.

A contact pin is for example a metallic pin configured for establishing an electrical connection with the least possible contact resistance. For this purpose, the contact pin is contacted by a corresponding receptacle when the plug is connected to the socket of the plug connector. The receptacle can be configured for clamping the contact pin.

By virtue of the distance between two contact pins being chosen to be greater than the length of a contact pin, a contact pin that is bent over or angled away cannot establish a short circuit with another contact pin. The distance can be chosen to be greater than double the length of a contact pin.

The neutral reference potential is a ground potential, for example, but can also be some other specific potential defined as a neutral reference potential within the optical system.

In accordance with an embodiment of the optical system, the number of control units is $N2 \geq 2$ and the N2 control units have an identical construction. Furthermore, the optical system has a number N3 of central control units for controlling the N2 control units, where $N3 \geq 1$, wherein each central control unit is assigned at least two of the N2 control units, and wherein a further interface for electrically coupling the respective central control unit to the assigned control units in order to transmit electrical signals between the central control unit and the control units has a bundle of electrical lines for each of the control units assigned to the central control unit, wherein the bundles of the further interface each comprise the same number of electrical lines for each of the control units assigned to the central control unit.

In this embodiment, the central control unit can be configured for controlling a plurality of control units each configured for controlling a plurality of arrangements. By way of example, the central control unit is a central control computer which determines target positions for respective actuators of the arrangements and outputs them to the respective control unit. A respective control unit comprises for example a driver circuit that drives the respective actuator or the respective actuators of an arrangement. It may also be stated that the system is divided into a plurality of hierarchically ordered levels, wherein the central control units form a higher-order level, the control units form a level subordinate thereto, and the arrangements form a further level subordinate to the control units. In line with this concept, the optical system is extendable by further levels, for example by a higher-order level than that of the central control units.

By way of example, a central control unit, four control units and, per control unit, four arrangements each having two actuator/sensor devices are provided. It is thus desirable for a total of 32 actuator/sensor devices on 16 arrangements to be controlled by the central control unit. The central control unit is connected to the four control units for example via the further interface via four bundles of electrical lines, wherein one bundle each is present for a control unit. Each control unit is connected by a respective bundle of electrical lines to the four arrangements assigned to the respective control unit. In this case, a respective bundle of electrical lines that connects the control unit to the respective arrangement can comprise separate lines for the two actuator/sensor devices of the arrangement.

A defect in one of the bundles from the central control unit to the respective control unit would therefore result only in a failure of the one control unit, instead of a failure of all the control units when the latter are connected to the central control unit via a common electrical line.

It should be noted that the central control unit and the control units can be arranged on a common circuit board or printed circuit board. In addition, all or some of the arrangements can likewise be arranged on the printed circuit board.

In embodiments, the optical system is embodied as a multimirror arrangement comprising a plurality N4 of mirrors, wherein at least one actuator/sensor device is assigned to each of the N4 mirrors (where N4≥2).

In accordance with an embodiment of the optical system, the central control unit (where N3=1), the N2 control units and the N1 arrangements are connected in a tree structure.

The tree structure is based for example on a rooted tree in which the central control unit forms the root, the control units form the branches and the arrangements or the actuator/sensor devices form the leaves.

The tree structure produces a direct connection and thus short latencies between the central control units and the control units and also between the control units and the arrangements with their actuator/sensor devices.

Furthermore, on account of the tree structure, in the event of a defect in a specific part within the tree structure, only the subordinate parts are affected by the defect. Elements of equal rank, i.e. for example two arrangements or two control units, cannot mutually influence one another.

In accordance with an embodiment of the optical system, the actuator/sensor device is embodied as an actuator device for displacing the optical component, as a sensor device for determining a position of the optical component or as an actuator and sensor device for displacing the optical component and for determining a position of the optical component.

A respective actuator is embodied for example as a Lorenz actuator or an electrostrictive actuator. A respective sensor is embodied for example as an eddy current sensor, an electrostrictive sensor or an optical sensor.

In accordance with a second aspect, the disclosure provides a lithography apparatus comprising an optical system in accordance with the first aspect is proposed.

The lithography apparatus can comprise a plurality of optical systems in accordance with the first aspect. A central control device configured for controlling the plurality of optical systems can be provided. A respective interface between higher-ranked elements of the lithography apparatus and subordinate elements of the lithography apparatus can each be embodied as explained with reference to the optical system.

The lithography apparatus can comprise a beam shaping and illumination system and can comprise one or more evacuable chambers or vacuum housings. During operation of the lithography apparatus, said evacuable chamber can be evacuated for example to a pressure of less than 50 Pa, such as less than 20 Pa, as an example less than 10 Pa, for example less than 5 Pa. In this case, this pressure indicates for example the partial pressure of hydrogen in the evacuable chamber. The beam shaping and illumination system comprises for example a radiation source, for example an EUV radiation source with an emitted used radiation in the range of between 0.1 nm and 30 nm, such as between 4 and 6 nm. This can be a plasma source, for example a GDPP (Gas Discharge Produced Plasma) source or an LPP (Laser Produced Plasma) source. Other EUV radiation sources, for example based on a synchrotron or on a free electron laser (FEL), are also possible. The radiation generated by the radiation source can comprise high-energy photons. For example, high-energy photons from the radiation source, for example EUV photons, can result in production of a plasma, for example a hydrogen plasma. Alternatively, argon (Ar) or helium (He) can be used as purge gas. Here, for example oxygen (O) and nitrogen (N) can then be used as admixtures.

In accordance with a third aspect, the disclosure provides a method for producing an optical system for a lithography apparatus is proposed. The method comprises the following steps:

a) providing a plurality of optical components for guiding radiation in the optical system, b) providing a plurality N1 of arrangements, where N1≥2, wherein each of the N1 arrangements comprises at least one actuator/sensor device, c) assigning the actuator/sensor devices of the N1 arrangements to the optical components, d) providing a number N2 of control units for controlling the number N1 of arrangements, where N2≥1, e) assigning the N1 arrangements to the N2 control units, and f) coupling the N1 arrangements to the N2 control units in order to transmit electrical signals between the respective control unit and the arrangements assigned to the control unit, wherein a respective bundle of electrical lines is used for each of the N1 arrangements.

The optical system produced in this way has for example the properties of the optical system in accordance with the first aspect. The embodiments and features described for the optical system in accordance with the first aspect are correspondingly applicable to the proposed production method, and vice versa.

Providing the respective arrangement and/or the respective control unit comprises for example producing the respective arrangement and/or the respective control unit, wherein the electrical lines used for step f) have already been provided in this case; for example, corresponding conductor tracks are integrated on a printed circuit board.

If the control unit and an arrangement are arranged on separate printed circuit boards and/or spatially separately from one another, step f) can furthermore comprise connecting a plug to a socket of a plug connector configured for connecting the electrical lines of the bundle.

In accordance with an aspect, the disclosure provides a method for operating an optical system in accordance with the first aspect is proposed. The method comprises the following steps:

transmitting a first electrical signal from a control unit to a first arrangement of the plurality N1 of arrangements via the interface, wherein the first electrical signal is transmitted exclusively via a first bundle of electrical lines of the interface, and transmitting a second electrical signal from the control unit to a second arrangement of the plurality N1 of arrangements via the interface, wherein the second electrical signal is transmitted exclusively via a second bundle of electrical lines of the interface.

This method means that the first and second electrical signals are transmitted via electrical lines of the respective bundle that are physically separate from one another, which is why mutual influencing of the signal transmission is avoided. For example, an effect of a failure and/or defect of a bundle or an electrical line of a bundle on the arrangement connected via the affected bundle is restricted. All further arrangements can continue to be operated without disruptions and faults, on account of the physically separate signal routing.

The embodiments and features described for the optical system in accordance with the first aspect are correspondingly applicable to the proposed operating method, and vice versa.

In accordance with an embodiment of the method, a respective electrical signal is transmitted to a respective arrangement via a plurality of bundles. In addition, the following steps are carried out:

detecting an electrical defect in a specific one of the plurality of bundles of electrical lines, interrupting the transmission of the electrical signal via the specific bundle of electrical lines, and continuing the transmission of the respective electrical signals via the plurality of bundles of electrical lines without the specific bundle of electrical lines.

By way of example, the control unit comprises a logic or a sensor configured to monitor and/or to check the signal transmission via a respective bundle of electrical lines. If a fault in the signal transmission, for example a short circuit between two electrical lines of one bundle or a short circuit between one electrical line and another component and/or conductive element of the control unit and/or arrangement, is detected, the signal transmission via the affected bundle is interrupted. This can result in a failure of the arrangement controlled via the affected bundle.

In embodiments, redundant signal transmission paths can be provided; for example, each bundle can comprise at least one additional electrical line which initially is not connected up and which, in the event of failure of another electrical line of the bundle, can perform the function of the failed electrical line. That is to say that after the failure of another electrical line of the bundle, the respective additional electrical line is used for transmitting the electrical signals which have hitherto been transmitted via the electrical line that has failed.

This protects the electronics of the control unit and/or of the arrangement; secondly, this ensures that the further arrangements controlled by the control unit can continue to be operated without faults and disruptions. By way of example, a multiplexing unit configured for selectively connecting up the respective additional electrical line is provided.

"A(n); one" in the present case should not necessarily be understood as restrictive to exactly one element. Rather, a plurality of elements, such as two, three or more, can also be provided. Nor should any other numeral used here be understood to the effect that there is a restriction to exactly the stated number of elements. Rather, unless indicated otherwise, numerical deviations upward and downward are possible.

Further possible implementations of the disclosure also encompass not explicitly mentioned combinations of features or embodiments that are described above or hereinafter with respect to the exemplary embodiments. In this case, a person skilled in the art will also add individual aspects as improvements or supplements to the respective basic form of the disclosure.

Further configurations and aspects of the disclosure are the subject of the dependent claims and also of the exemplary embodiments of the disclosure that are described hereinafter. The disclosure is explained in greater detail hereinafter on the basis of embodiments with reference to the accompanying figures.

DETAILED DESCRIPTION

Unless indicated otherwise, elements that are identical or functionally identical have been provided with the same reference signs in the figures. It should also be noted that the illustrations in the figures are not necessarily true to scale.

Figure 1:
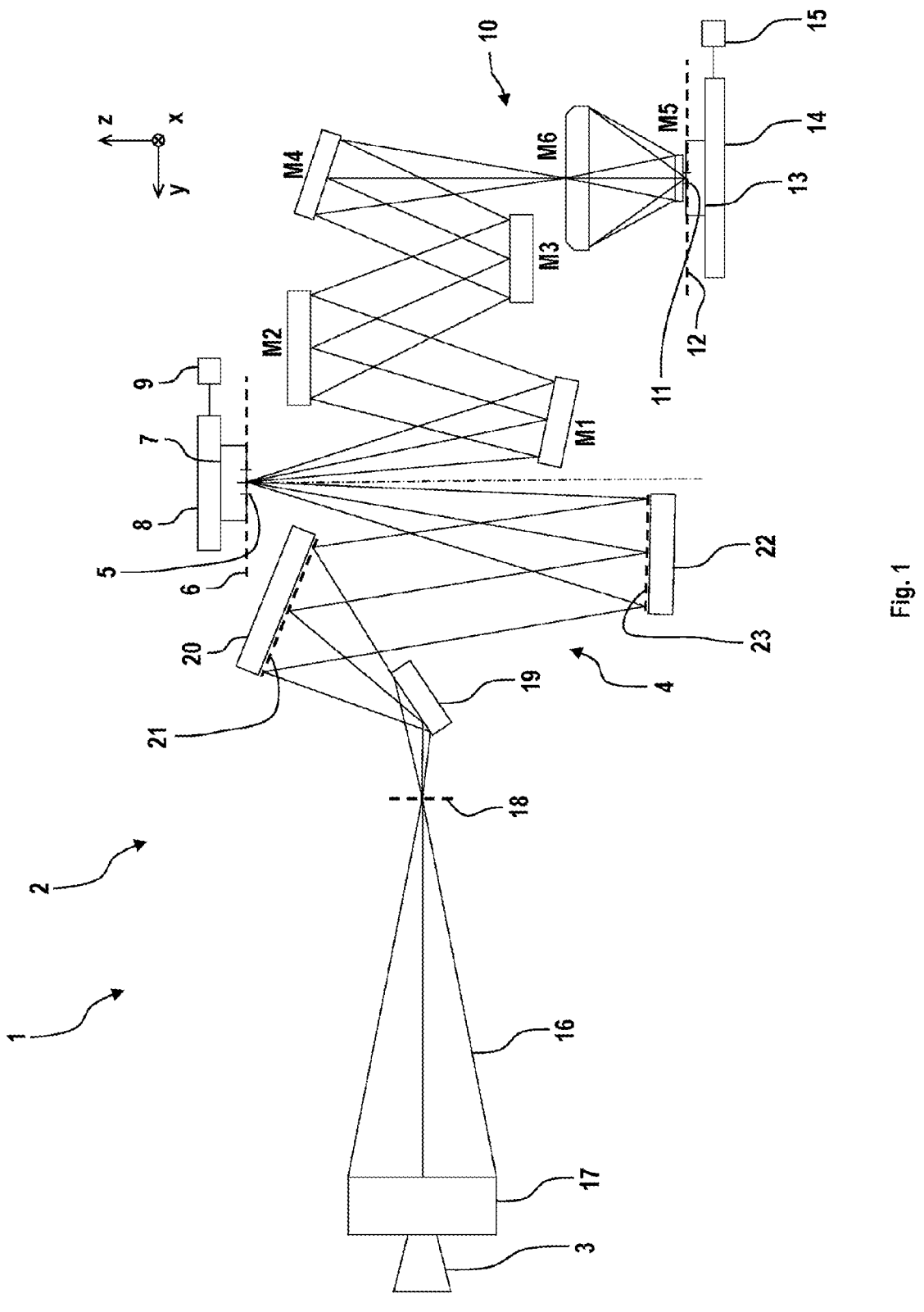
FIG. 1 shows a schematic meridional section of a projection exposure apparatus for EUV projection lithography.

FIG. 1 shows one embodiment of a projection exposure apparatus 1 (lithography apparatus), for example an EUV lithography apparatus. One embodiment of an illumination system 2 of the projection exposure apparatus 1 has, in addition to a light or radiation source 3, an illumination optical unit 4 for illuminating an object field 5 in an object plane 6. In an alternative embodiment, the light source 3 can also be provided as a module separate from the rest of the illumination system 2. In this case, the illumination system 2 does not comprise the light source 3.

A reticle 7 arranged in the object field 5 is exposed. The reticle 7 is held by a reticle holder 8. The reticle holder 8 is displaceable by way of a reticle displacement drive 9, for example in a scanning direction.

FIG. 1 shows, for explanatory purposes, a Cartesian coordinate system with an x-direction x, a y-direction y and a z-direction z. The x-direction x runs perpendicularly into the plane of the drawing. The y-direction y runs horizontally, and the z-direction z runs vertically. The scanning direction in FIG. 1 runs in the y-direction y. The z-direction z runs perpendicularly to the object plane 6.

The projection exposure apparatus 1 comprises a projection optical unit 10. The projection optical unit 10 serves for imaging the object field 5 into an image field 11 in an image plane 12. The image plane 12 extends parallel to the object plane 6. Alternatively, an angle that differs from 0° between the object plane 6 and the image plane 12 is also possible.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15, for example in the y-direction y. The displacement firstly of the reticle 7 by way of the reticle displacement drive 9 and secondly of the wafer 13 by way of the wafer displacement drive 15 can be implemented so as to be mutually synchronized.

The light source 3 is an EUV radiation source. The light source 3 emits for example EUV radiation 16, which is also referred to below as used radiation, illumination radiation or illumination light. For example, the used radiation 16 has a wavelength in the range between 5 nm and 30 nm. The light source 3 can be a plasma source, for example an LPP (short for: laser produced plasma) source or a DPP (short for: gas-discharge produced plasma) source. It can also be a synchrotron-based radiation source. The light source 3 can be an FEL (short for: free-electron laser).

The illumination radiation 16 emanating from the light source 3 is focused by a collector 17. The collector 17 can be a collector with one or more ellipsoidal and/or hyperboloidal reflection surfaces. The at least one reflection surface of the collector 17 can be impinged upon by the illumination radiation 16 with grazing incidence (abbreviated as: GI), which is to say with angles of incidence greater than 45°, or with normal incidence (abbreviated as: NI), which is to say with angles of incidence less than 45°. The collector 17 can be structured and/or coated, firstly to optimize its reflectivity for the used radiation and secondly to suppress extraneous light.

Downstream of the collector 17, the illumination radiation 16 propagates through an intermediate focus in an intermediate focal plane 18. The intermediate focal plane 18 can represent a separation between a radiation source module, having the light source 3 and the collector 17, and the illumination optical unit 4.

The illumination optical unit 4 comprises a deflection mirror 19 and, arranged downstream thereof in the beam path, a first facet mirror 20. The deflection mirror 19 can be a plane deflection mirror or, alternatively, a mirror with a beam-influencing effect that goes beyond the purely deflecting effect. As an alternative or in addition, the deflection mirror 19 can be in the form of a spectral filter that separates a used light wavelength of the illumination radiation 16 from extraneous light at a wavelength deviating therefrom. If the first facet mirror 20 is arranged in a plane of the illumination optical unit 4 that is optically conjugate to the object plane 6 as a field plane, it is also referred to as a field facet mirror. The first facet mirror 20 comprises a multiplicity of individual first facets 21, which can also be referred to as field facets. Only some of these first facets 21 are shown in FIG. 1 by way of example.

The first facets 21 can be embodied as macroscopic facets, for example as rectangular facets or as facets with an arcuate or part-circular edge contour. The first facets 21 can be in the form of plane facets or alternatively in the form of convexly or concavely curved facets.

As is known for example from DE 10 2008 009 600 A1, the first facets 21 themselves can also each be composed of a multiplicity of individual mirrors, for example a multiplicity of micromirrors. For example, the first facet mirror

20 can be embodied as a microelectromechanical system (MEMS system). For details, reference is made to DE 10 2008 009 600 A1.

Between the collector 17 and the deflection mirror 19, the illumination radiation 16 propagates horizontally, i.e. in the y-direction y.

In the beam path of the illumination optical unit 4, a second facet mirror 22 is arranged downstream of the first facet mirror 20. If the second facet mirror 22 is arranged in a pupil plane of the illumination optical unit 4, it is also referred to as a pupil facet mirror. The second facet mirror 22 can also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1 and U.S. Pat. No. 6,573,978.

The second facet mirror 22 comprises a plurality of second facets 23. In the case of a pupil facet mirror, the second facets 23 are also referred to as pupil facets.

The second facets 23 can likewise be macroscopic facets, which can, for example, have a round, rectangular or hexagonal boundary, or alternatively be facets composed of micromirrors. In this regard, reference is likewise made to DE 10 2008 009 600 A1.

The second facets 23 can have plane or, alternatively, convexly or concavely curved reflection surfaces.

The illumination optical unit 4 thus forms a double-faceted system. This fundamental principle is also referred to as a fly's eye condenser (or integrator).

It can be desirable to arrange the second facet mirror 22 not exactly in a plane that is optically conjugate to a pupil plane of the projection optical unit 10. For example, the second facet mirror 22 can be arranged so as to be tilted in relation to a pupil plane of the projection optical unit 10, as is described for example in DE 10 2017 220 586 A1.

With the aid of the second facet mirror 22, the individual first facets 21 are imaged into the object field 5. The second facet mirror 22 is the last beam-shaping mirror or indeed the last mirror for the illumination radiation 16 in the beam path upstream of the object field 5.

In a further embodiment (not illustrated) of the illumination optical unit 4, a transfer optical unit can be arranged in the beam path between the second facet mirror 22 and the object field 5, said transfer optical unit contributing for example to the imaging of the first facets 21 into the object field 5. The transfer optical unit can have exactly one mirror or, alternatively, two or more mirrors, which are arranged in succession in the beam path of the illumination optical unit 4. The transmission optical unit can comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the first facet mirror 20, and the second facet mirror 22.

In a further embodiment of the illumination optical unit 4, there is also no need for the deflection mirror 19, and so the illumination optical unit 4 can then have exactly two mirrors downstream of the collector 17, specifically the first facet mirror 20 and the second facet mirror 22.

The imaging of the first facets 21 into the object plane 6 via the second facets 23 or using the second facets 23 and a transfer optical unit is routinely only approximate imaging.

The projection optical unit 10 comprises a plurality of mirrors Mi, which are consecutively numbered in accordance with their arrangement in the beam path of the projection exposure apparatus 1.

In the example shown in FIG. 1, the projection optical unit 10 comprises six mirrors M1 to M6. Alternatives with four, eight, ten, twelve or any other number of mirrors Mi are likewise possible. The projection optical unit 10 is a doubly obscured optical unit. The penultimate mirror M5 and the last mirror M6 each have a through opening for the illumination radiation 16. The projection optical unit 10 has an image-side numerical aperture that is greater than 0.5 and can also be greater than 0.6 and can be for example 0.7 or 0.75.

Reflection surfaces of the mirrors Mi can be in the form of free-form surfaces without an axis of rotational symmetry. Alternatively, the reflection surfaces of the mirrors Mi can be designed as aspherical surfaces with exactly one axis of rotational symmetry of the reflection surface shape. Just like the mirrors of the illumination optical unit 4, the mirrors Mi can have highly reflective coatings for the illumination radiation 16. These coatings can be designed as multilayer coatings, for example with alternating layers of molybdenum and silicon.

The projection optical unit 10 has a large object-image offset in the y-direction y between a y-coordinate of a center of the object field 5 and a y-coordinate of the center of the image field 11. This object-image offset in the y-direction y can be of approximately the same magnitude as a z-distance between the object plane 6 and the image plane 12.

For example, the projection optical unit 10 can have an anamorphic embodiment. It has for example different imaging scales $\beta x$, $\beta y$ in the x- and y-directions x, y. The two imaging scales $\beta x$, $\beta y$ of the projection optical unit 10 can be ($\beta x$, $\beta y$)=(+/−0.25, +/−0.125). A positive imaging scale $\beta$ means imaging without image inversion. A negative sign for the imaging scale $\beta$ means imaging with image inversion.

The projection optical unit 10 consequently leads to a reduction in size with a ratio of 4:1 in the x-direction x, which is to say in a direction perpendicular to the scanning direction.

The projection optical unit 10 leads to a reduction in size of 8:1 in the y-direction y, which is to say in the scanning direction.

Other imaging scales are likewise possible. Imaging scales with the same sign and the same absolute value in the x-direction x and y-direction y are also possible, for example with absolute values of 0.125 or of 0.25.

The number of intermediate image planes in the x-direction x and in the y-direction y in the beam path between the object field 5 and the image field 11 can be the same or can differ, depending on the embodiment of the projection optical unit 10. Examples of projection optical units with different numbers of such intermediate images in the x- and y-directions x, y are known from US 2018/0074303 A1.

In each case one of the second facets 23 is assigned to exactly one of the first facets 21 for respectively forming an illumination channel for illuminating the object field 5. This can result in illumination according to the Köhler principle. The far field is decomposed into a multiplicity of object fields 5 with the aid of the first facets 21. The first facets 21 produce a plurality of images of the intermediate focus on the second facets 23 respectively assigned to them.

By way of an assigned second facet 23, the first facets 21 are in each case imaged onto the reticle 7 in a manner overlaid on one another for the purposes of illuminating the object field 5. The illumination of the object field 5 is for example as homogeneous as possible. It can have a uniformity error of less than 2%. Field uniformity can be achieved by superposing different illumination channels.

The illumination of the entrance pupil of the projection optical unit 10 can be defined geometrically by an arrangement of the second facets 23. The intensity distribution in the entrance pupil of the projection optical unit 10 can be set by selecting the illumination channels, for example the subset of the second facets 23, which guide light. This intensity distribution is also referred to as illumination setting or illumination pupil filling.

A likewise preferred pupil uniformity in the region of portions of an illumination pupil of the illumination optical unit 4 which are illuminated in a defined manner can be achieved by a redistribution of the illumination channels.

Further aspects and details of the illumination of the object field 5 and for example of the entrance pupil of the projection optical unit 10 are described below.

For example, the projection optical unit 10 can comprise a homocentric entrance pupil. The latter can be accessible. It can also be inaccessible.

The entrance pupil of the projection optical unit 10 regularly cannot be exactly illuminated with the second facet mirror 22. When imaging the projection optical unit 10, which images the center of the second facet mirror 22 telecentrically onto the wafer 13, the aperture rays often do not intersect at a single point. However, it is possible to find an area in which the spacing of the aperture rays that is determined in pairs becomes minimal. This area represents the entrance pupil or an area in real space that is conjugate thereto. For example, this area has a finite curvature.

It may be the case that the projection optical unit 10 has different poses of the entrance pupil for the tangential beam path and for the sagittal beam path. In this case, an imaging element, for example an optical component of the transfer optical unit, should be provided between the second facet mirror 22 and the reticle 7. With the aid of this optical element, the different poses of the tangential entrance pupil and the sagittal entrance pupil can be taken into account.

In the arrangement of the component parts of the illumination optical unit 4 shown in FIG. 1, the second facet mirror 22 is arranged in an area conjugate to the entrance pupil of the projection optical unit 10. The first facet mirror 20 is arranged tilted in relation to the object plane 6. The first facet mirror 20 is arranged tilted in relation to an arrangement plane defined by the deflection mirror 19. The first facet mirror 20 is arranged tilted in relation to an arrangement plane defined by the second facet mirror 22.

The first facet mirror 20, the second facet mirror 22 or else each of the mirrors M1-M6 are examples of a respective optical system 100 (see FIG. 2, 3, 8 or 9). The individual facets 21, 23 of the facet mirrors 20, 22 are examples of optical elements 101 (see FIG. 2) of the optical system 100. In FIG. 1, a plurality of optical systems 100 form a superordinate optical system, such as the illumination optical unit 4 or the projection optical unit 10.

For the individual control of the facets 21, 22 or other displaceable optical elements 101 of the respective optical system 100, a modularly constructed electronics arrangement is provided, for example, which comprises at least one control unit 130 (see FIG. 2, 3, 8 or 9) and a plurality of arrangements 111-114 (see FIG. 2, 3, 8 or 9) coupled via an interface 140 (see FIG. 2, 3, 8 or 9). This set-up, and for example the coupling of the respective elements via the interface 140, is explained in detail below with reference to FIGS. 2-9.

Figure 2:
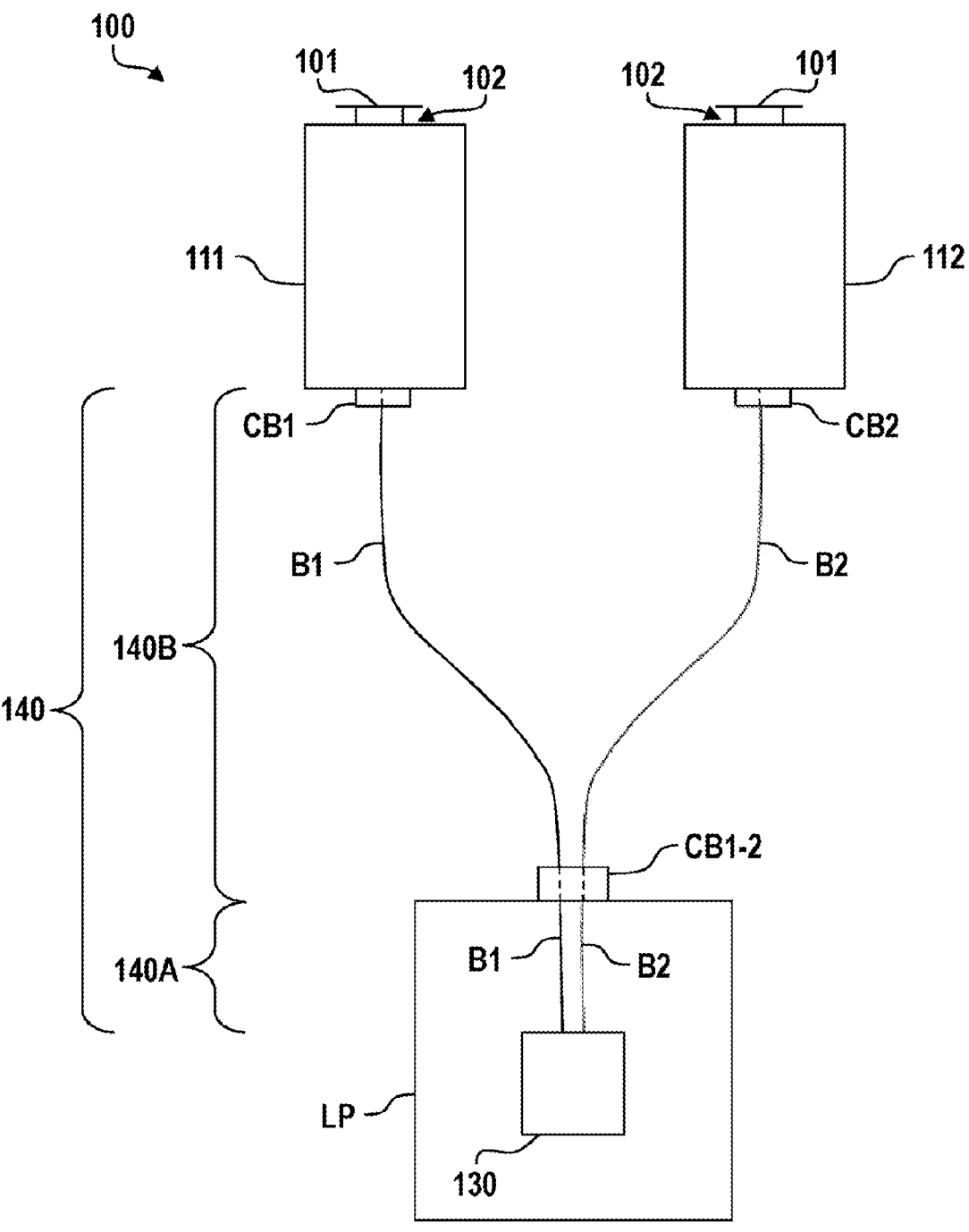
FIG. 2 shows a schematic first exemplary embodiment of an optical system.

FIG. 2 shows a schematic first exemplary embodiment of an optical system 100 which is usable for example in the projection exposure apparatus 1 from FIG. 1, for example in the illumination optical unit 4 or the projection optical unit 10. In this example, the optical system 100 in FIG. 2 comprises two optical elements 101 embodied as micromirrors. It should be noted that the optical system 100 can comprise multiple instances of the illustrated elements and overall can form a micromirror arrangement comprising hundreds or thousands of micromirrors. The optical system 100 can also form one of the facet mirrors 20, 22 (see FIG. 1), wherein the optical elements 101 then form the facets 21, 23 (see FIG. 1). The micromirrors 101 are arranged on a respective arrangement 111, 112, wherein a respective actuator/sensor device 102 is configured for displacing the respective micromirror 101 and/or for detecting a position of the respective micromirror 101. Furthermore, the optical system 100 comprises a control unit 130 configured for controlling the two arrangements 111, 112 via corresponding electrical control signals. The control signals are electrical signals and can comprise a data signal and/or electrical energy for operating the respective arrangement 111, 112. In this case, the arrangements 111, 112 have an identical construction, such that they are also controlled by electrical signals of identical type, for which reason the bundles B1, B2 can likewise have an identical construction. In this example, the control unit 130 is arranged on a printed circuit board LP.

The control unit 130 is coupled to the arrangements 111, 112 via an interface 140. The interface 140 is configured for transmitting the control signals from the control unit 130 to the respective arrangement 111, 112 and for transmitting detected sensor signals of the respective actuator/sensor device 102 from the arrangements 111, 112 to the control unit 130. For each arrangement 111, 112, the interface 140 has a respective bundle B1, B2 of electrical lines. Each bundle B1, B2 comprises for example a plurality of electrical lines, for example two voltage-carrying lines for transmitting an electrical power for operating the respective arrangement 111, 112 and one or more signal lines via which analog and/or digital data signals are transmitted.

In this example, the interface 140 comprises two portions 140A, 140B. A first portion 140A runs on the circuit board LP of the control unit 130 from the control unit 130 as far as a connector CB1-2. A second portion 140B runs between the connector CB1-2 and a respective connector CB1, CB2 arranged at the respective arrangement 111, 112. A respective bundle B1, B2 of electrical lines, for example a respective cable, is formed in the second portion 140B. In the first portion 140A, the electrical lines of the two bundles B1, B2 run separately from one another on the printed circuit board LP, for example in different printed circuit board layers L1-L4 (see FIG. 4 or 7) and/or at a significant distance from one another, thereby precluding mutual influencing.

For example, the embodiment of the bundles B1, B2 as dedicated line bundles for a respective arrangement 111, 112 continuously along the entire signal transmission path from the control unit 130 to the arrangements 111, 112 ensures that in the event of a defect in one of the bundles B1, B2, such as a short circuit or lack of contact, for example, which may occur for example in the connector CB1-2 during the integration of the optical system, the respective other bundle B1, B2 is not affected by this. Therefore, a corresponding defect will also only have a limited effect, that is to say that only one of the two arrangements 111, 112 will be affected by the defect. By contrast, in the case of common line routing at least in portions, a defect would have the consequence that both arrangements 111, 112 would be affected and would possibly fail.

It should be noted at this juncture that a modular construction of the optical system 100 in the form of subsystems having limited functional scope, which provide the functional scope used for the respective application only when they are jointly interconnected, is familiar to a person skilled in the art. The modular construction means that the failure of one subsystem does not adversely affect the functionality of the further subsystems. In order to minimize the complexity of the optical system 100, however, hitherto a layout which is as simple as possible, with the fewest possible electrical lines, has been chosen for signal transmission purposes, in order to minimize the production outlay and integration outlay and to save installation space, since the optical system 100 is used for example in a confined space in a vacuum housing of a lithography apparatus. Such a layout which is as simple as possible may possibly result in a cost saving, but a defect in one of the lines often leads to a failure of a plurality of subsystems simultaneously, which conflicts with certain features of the modular construction. This problem is overcome by the proposed construction of the optical system 100, for example the embodiment of the interface 140.

Figure 3:
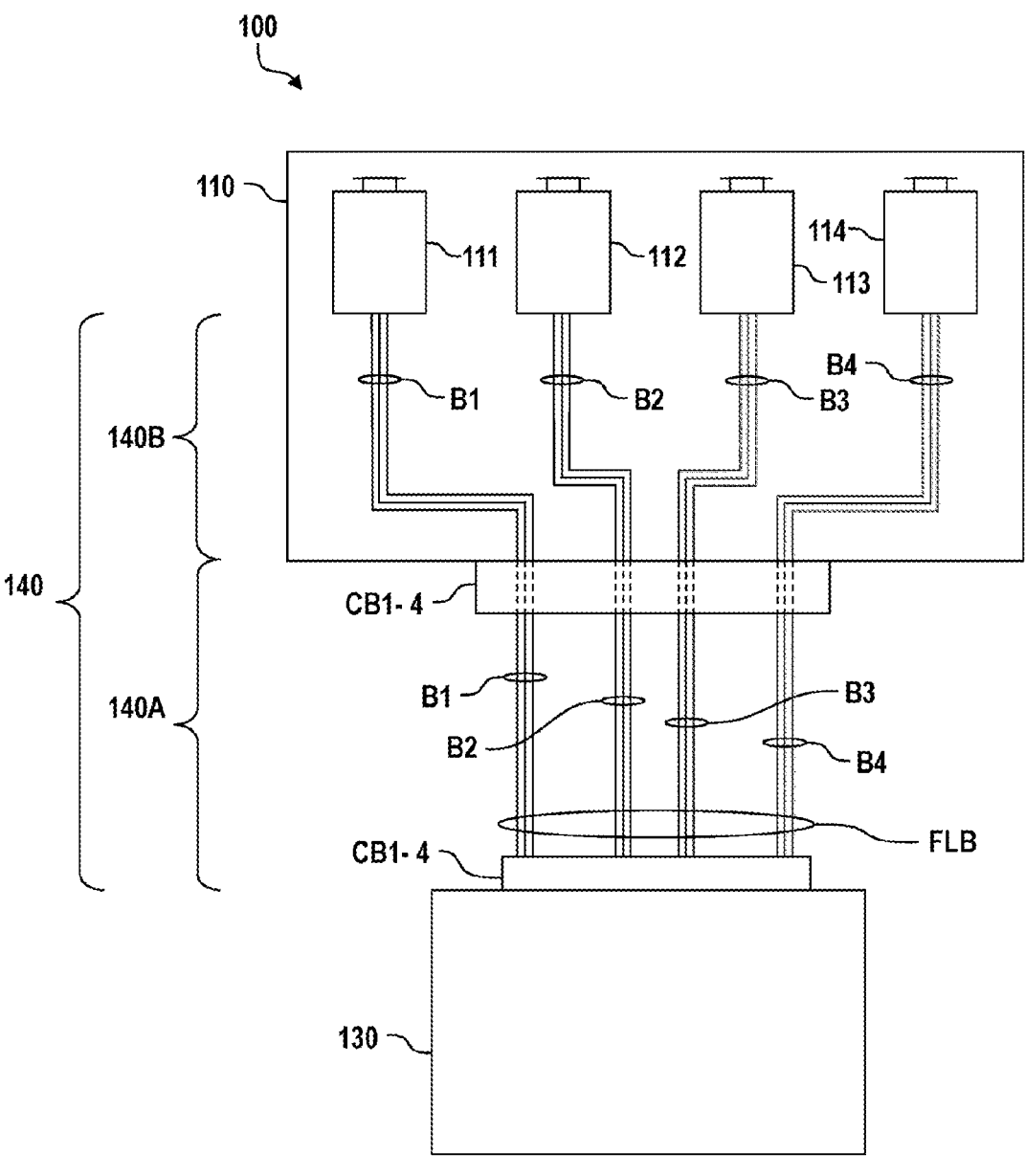
FIG. 3 shows a schematic second exemplary embodiment of an optical system.

FIG. 3 shows a schematic second exemplary embodiment of an optical system 100 which is usable for example in the projection exposure apparatus 1 from FIG. 1, for example in the illumination optical unit 4 or the projection optical unit 10. In this example, the optical system comprises four arrangements 111-114, wherein each arrangement 111-114 comprises a respective actuator/sensor device 102 (see FIG. 2) and a respective assigned optical element 101 (see FIG. 2), which are not identified by a respective reference sign in FIG. 3 for reasons of clarity. In this example, the four arrangements 111-114 are combined in a module 110. Furthermore, a control unit 130 is present, which is configured for controlling the four arrangements 111-114. The control unit 130 is connected to the four arrangements 111-114 via an interface 140. The interface 140 comprises a separate bundle B1-B4 of electrical lines for each of the arrangements 111-114, three separate lines per bundle B1-B4 being indicated schematically here. This number is merely by way of example and not limiting; rather, a respective bundle B1-B4 can also comprise fewer or more than three lines.

In this example, the interface 140 has two portions 140A, 140B. The first portion 140A runs from a plug connector CB1-4 arranged on the control unit 130 to a further plug connector CB1-4 arranged on the module 110. A respective plug connector CB1-4 comprises a plug and a socket (not illustrated separately). Between the plug connectors CB1-4, the bundles B1-B4 run for example in separate cables, in a common cable or else in a flexible printed circuit board FLB. The second portion 140B runs in the module 110, which comprises a printed circuit board, for example, in which the bundles B1-B4 run separately from one another. This embodiment of the interface 140 affords some of the same properties as already described with reference to FIG. 2.

It should be noted that the optical system 100 can comprise multiple instances of the illustrated elements 110, 130, 140 and overall can form a micromirror arrangement comprising hundreds or thousands of micromirrors. The optical system 100 can also for one of the facet mirrors 20, 22 (see FIG. 1), wherein the optical elements 101 then form the facets 21, 23 (see FIG. 1).

Figure 4:
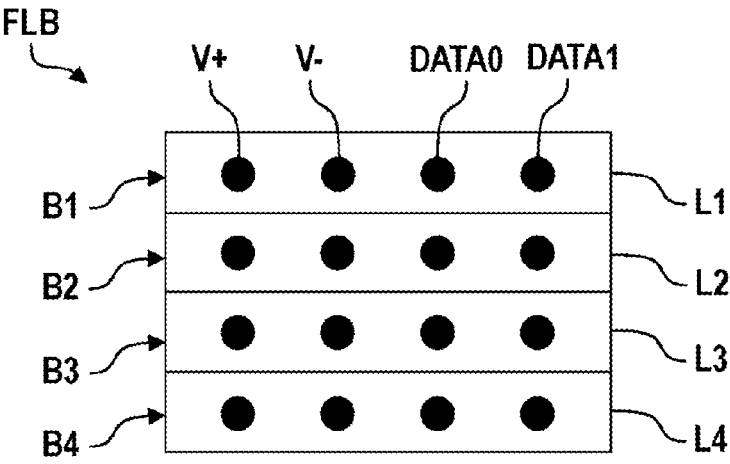
FIG. 4 shows a schematic first exemplary embodiment of an arrangement of lines in a printed circuit board.

FIG. 4 shows a schematic first exemplary embodiment of an arrangement of lines in a printed circuit board, the latter being a flexible printed circuit board FLB. In this example, the flexible printed circuit board FLB comprises four layers L1-L4 electrically isolated from one another. In this case, the lines are embodied as conductor tracks on the printed circuit board FLB. Conductor tracks running in different layers L1-L4 are electrically isolated from one another. Since the plurality of bundles B1-B4 of electrical lines have to run separately with respect to one another, for example in a manner electrically isolated with respect to one another, it can be desirable to arrange different bundles B1-B4 in different layers L1-L4, as illustrated in FIG. 4.

A plurality of lines can run in a respective layer L1-L4. In this example, each of the bundles B1-B4 comprises four lines, by way of example two voltage-carrying lines V+, V−, a first data line DATA0 and a second data line DATA1. For example, electrical energy for operating a respective arrangement 111-114 (see FIG. 2, 3, 8 or 9) is transmitted via the voltage-carrying lines V+, V−. The operating voltage is optionally at most 60 volts. By way of example, analog or digital control signals and/or measurement signals are transmitted via the two data lines DATA0, DATA1. The different lines D0, D1, V+, V− can be designed in a manner specific to their respective specific task, i.e. can consist of different materials and/or comprise different cross-sections, for example. Moreover, an insulation between two respective lines within a bundle B1-B4 can be different, depending on the voltage and/or currents to be transmitted via a respective line.

Figure 5:
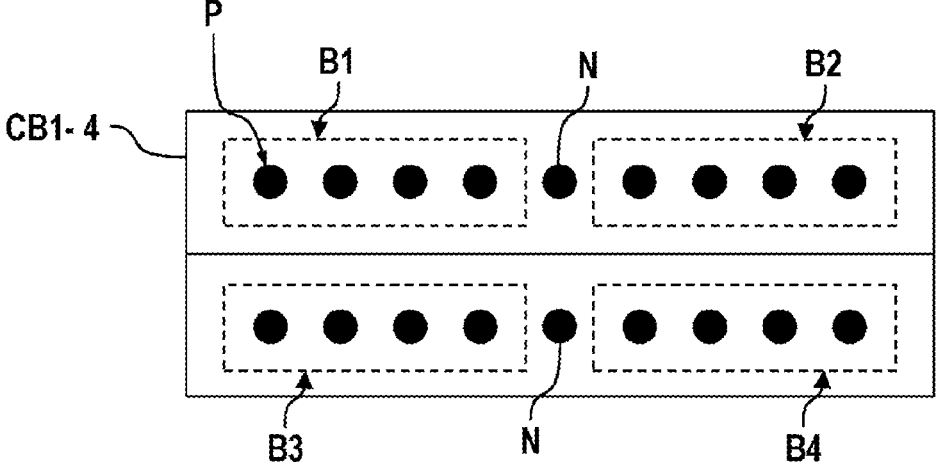
FIG. 5 shows a schematic exemplary embodiment of an arrangement of contact pins of a plug connector.

FIG. 5 shows a schematic exemplary embodiment of an arrangement of contact pins P of a plug connector CB1-4. In this example, the plug connector CB1-4 has a total of 18 contact pins P arranged in two rows. For reasons of clarity, only one contact pin P is provided with a reference sign. By way of example, a web composed of an insulating material (without a reference sign) runs between the two rows of contact pins P. This plug connector CB1-4 can be used for example for four bundles B1-B4 of in each case four electrical lines. An additional contact pin N is situated between the two respective bundles B1, B2 and B3, B4 arranged in a respective row. Said pin separates the two respective bundles B1-B4 from one another. The contact pin N is connected to a neutral reference potential, for example, or is not connected at all. This ensures that a contact between the respective adjacently arranged bundles B1, B2 and B3, B4 no contact is possible, even if one of the outer pins of a respective bundle B1-B4 is bent over. In embodiments, more than just one contact pin N that is unallocated or is connected to a neutral reference potential can be provided between two bundles. It should be noted that the plug connector CB1-4 comprises a respective plug with a corresponding socket.

Figure 6:
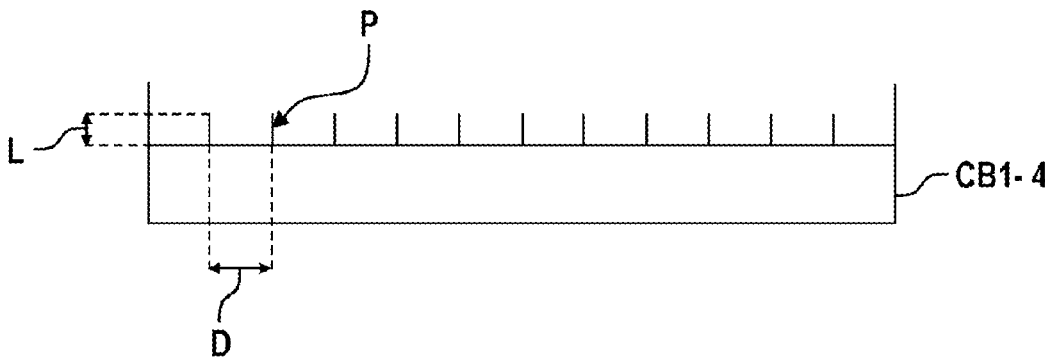
FIG. 6 shows a schematic exemplary embodiment of a plug connector.

FIG. 6 shows a schematic exemplary embodiment of a connecting plug CB1-4, a side view being illustrated. The side view reveals for example the contact pins P projecting from the plug CB1-4, only one contact pin P being identified with a reference sign for reasons of clarity. Furthermore, two geometric dimensions that are characteristic of the plug CB1-4 are depicted: the length L of a respective contact pin P and a distance D between each two contact pins P. The connecting plug CB1-4 is embodied for example in such a way that the distance D between each two contact pins P is greater than a respective length L of the contact pins P. This ensures that a contact pin P that has been bent over does not cause a short circuit with an adjacent contact pin P.

In embodiments of the connecting plug CB1-4, the distance D is greater than double the length L of a respective contact pin P, and so even in the unlikely case where two adjacent contact pins P are bent toward one another, no electrical contact is able to be established between these two contact pins P.

Figure 7:
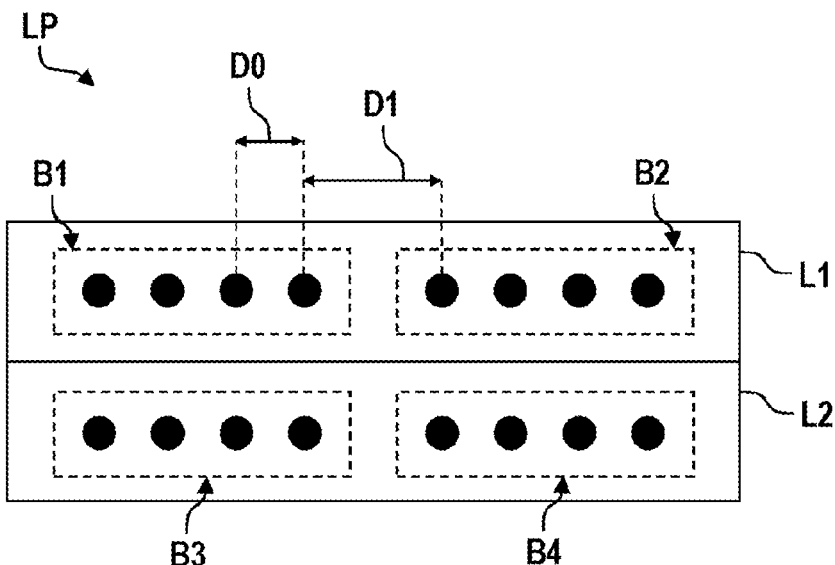
FIG. 7 shows a schematic second exemplary embodiment of an arrangement of lines in a printed circuit board.

FIG. 7 shows a schematic second exemplary embodiment of an arrangement of lines in a printed circuit board LP, which comprises two separate printed circuit board layers L1, L2 in this example. Four bundles B1-B4 of electrical lines, each of which comprises four separate lines, run in the printed circuit board LP. As already described with reference to FIG. 4, electrical lines that run in different layers L1, L2 are electrically insulated from one another. In this example, in each case two bundles B1, B2 and B3, B4 run in a respective common layer L1, L2. The lines thereof are also electrically insulated from one another, although not by a layer boundary but rather by the dielectric material arranged between two respective lines. In order to achieve a high level of immunity vis-à-vis mutual influencing of the bundles B1, B2 and B3, B4 despite the arrangement on identical layers L1, L2, the arrangement of the conductor tracks is not uniform, rather for example a distance D1 between conductor tracks of different bundles B1, B2 is chosen to be greater than a distance D0 between conductor tracks of a bundle. By way of example, the distance D1 is at least double the magnitude of the distance D0. In this way, it is possible to reliably avoid a situation in which a short circuit between conductor tracks associated with different bundles B1, B2 or B3, B4 occurs on account of electromigration or the like over the course of time.

Figure 8:
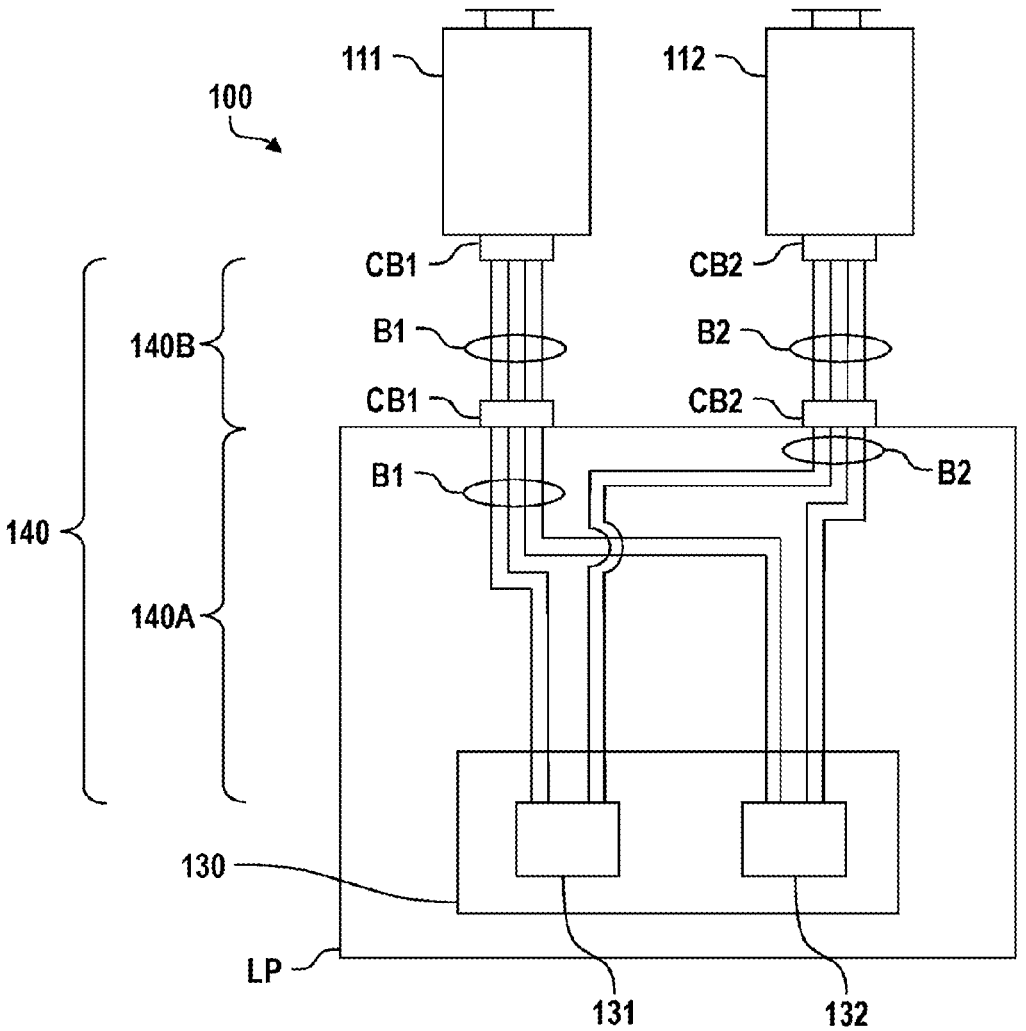
FIG. 8 shows a schematic third exemplary embodiment of an optical system.

FIG. 8 shows a schematic third exemplary embodiment of an optical system 100 which is usable for example in the projection exposure apparatus 1 from FIG. 1, for example in the illumination optical unit 4 or the projection optical unit 10. In this example, the optical system 100 comprises two arrangements 111, 112, wherein each arrangement 111-112 comprises a respective actuator/sensor device 102 (see FIG. 2) and a respective assigned optical element 101 (see FIG. 2), which are not identified by a respective reference sign in FIG. 8 for reasons of clarity. The optical system 100 furthermore comprises a control unit 130, which is configured for controlling the assigned arrangements 111, 112 and is coupled to the arrangements 111, 112 via an interface 140. The interface 140 comprises two bundles B1, B2 of electrical lines, wherein in this example a respective bundle B1, B2 comprises four lines, for example in this case two voltage-carrying lines and two data signal lines, as also explained with reference to FIG. 4.

In this example, the control unit 130 is arranged on a printed circuit board LP and comprises a logic unit 131 and a power unit 132. Further elements can be arranged on the printed circuit board LP; for example, the printed circuit board comprises a separate plug connector CB1, CB2 for each arrangement 111, 112. The logic unit 131 is embodied for example as a processor or an application-specific integrated circuit (ASIC) and is configured to generate and output open-loop and/or closed-loop control signals for a respective arrangement 111, 112, for example for controlling the respective actuator/sensor device 102 (see FIG. 2). In this case, the logic unit 131 can both receive control signals from a superordinate control unit, such as a central control computer, and/or receive sensor signals detected by the actuator/sensor devices 102 and process them for suitable open-loop or closed-loop control. The logic unit 131 has two separate lines (corresponding to the two data signal lines) for each of the arrangements 111, 112, said lines being operable unidirectionally or bidirectionally. The power unit 132 is embodied for example as a voltage source or a current source and is configured to provide the electrical energy used for operating the respective arrangement 111, 112. The power unit 132 likewise has two separate lines (corresponding to the two voltage-carrying lines) for each of the arrangements 111, 112.

On account of the spatial separation of logic unit 131 and power unit 132 in this example, the lines belonging to a respective bundle B1, B2 run in a spatially separated manner in portions. The interface 140 is subdivided into two portions 140A, 140B. In the first portion 140A, for example, the lines run in the printed circuit board LP. In this case a dedicated printed circuit board layer L1, L2 (see FIG. 7) can be provided for a respective bundle B1, B2. The lines of different bundles B1, B2 can thus cross one another, without this increasing a risk of mutual influencing. In this example, the second portion 140B comprises separate plug connectors CB1, CB2 for each of the arrangements on the printed circuit board LP and also separate connecting elements, such as a respective cable, which are connected to a respective plug connector CB1, CB2 on the respective arrangement 111, 112.

It should be noted that a respective internal structure of the logic unit 131 and of the power unit 132 can also have separate sub-regions for the signal processings and provision of the respective electrical signals (not illustrated), such that in the event of a failure of a respective sub-region, only the arrangement 111, 112 controlled by the respective sub-region is affected.

Figure 9:
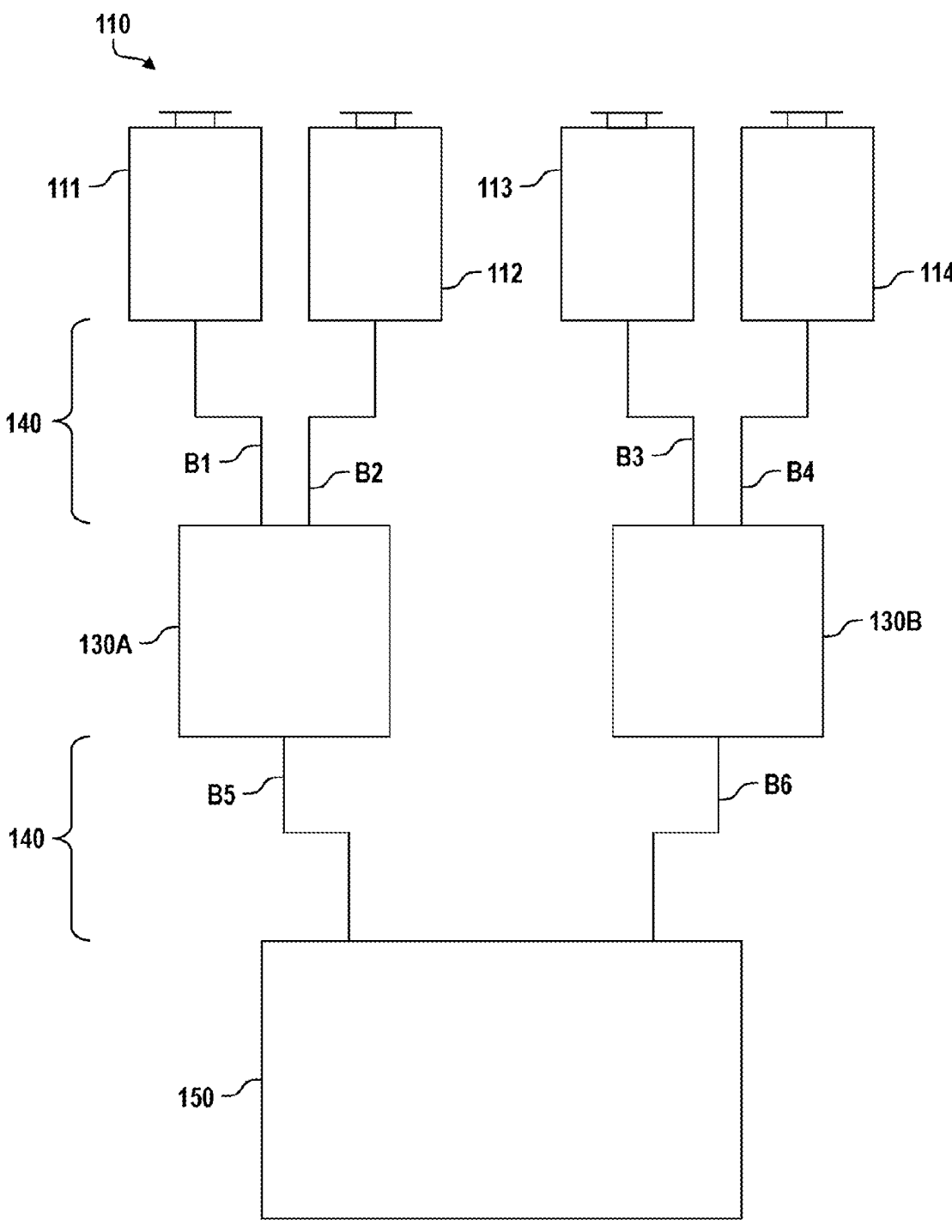
FIG. 9 shows a schematic view of one exemplary embodiment of an optical system having a plurality of structural and logical levels.

FIG. 9 shows a schematic view of one exemplary embodiment of an optical system 100 having a plurality of structural and logical levels. The optical system 100 can be used for example in the projection exposure apparatus 1 from FIG. 1, for example in the illumination optical unit 4 or the projection optical unit 10. The levels form a hierarchy, for example. In this example, three structural levels are present, wherein the arrangements 111-114 are arranged at a bottommost level, the control units 130A, 130B are arranged at a middle level, and a central control unit 150 is arranged at a highest level. The central control unit 150 is configured for controlling the two control units 130A, 130B assigned thereto. A respective control unit 130A, 130B is configured for controlling the arrangement 111-114 assigned to the respective control unit 130A, 130B. For this purpose, the levels are coupled among one another via a respective interface 140, wherein hierarchically successive levels are in each case connected to one another.

A respective interface 140 comprises a respective plurality of bundles B1-B6 of electrical lines, the number of bundles depending on the units to be controlled at the respective lower hierarchical level. Therefore, the interface 140 between the central control unit 150 and the control units 130A, 130B has two bundles B5, B6 (one for each control unit). If more than two control units are assigned to the central control unit 150, then the interface 140 comprises a correspondingly higher number of bundles. The respective interface 140 between a respective control unit 130A, 130B and the respective assigned arrangements 111-114 correspondingly likewise comprises in each case two bundles B1, B2 and B3, B4.

Different interfaces 140 which couple respective different pairs of levels can be embodied differently, for example with regard to their respective number of electrical lines and their purpose. By way of example, the bundles B5, B6 can be embodied only for transmitting data signals; transmission of electrical energy for operating the control units 130A, 130B is not provided since the control units 130A, 130B have a separate power supply (not illustrated), for example. The bundle B5 transmits for example the data used for controlling the arrangements 111, 112, while the bundle B6 transmits the data used for controlling the arrangements 113, 114. The respective control unit 130A, 130B controls the arrangements 111-114 on the basis of these control data.

The optical system 100 is arranged in a tree structure, for example, wherein in this example the central control unit 150 forms the root or the trunk, the control units 130A, 130B form the branches and the arrangements 111-114 form the leaves of the tree structure.

Figure 10:
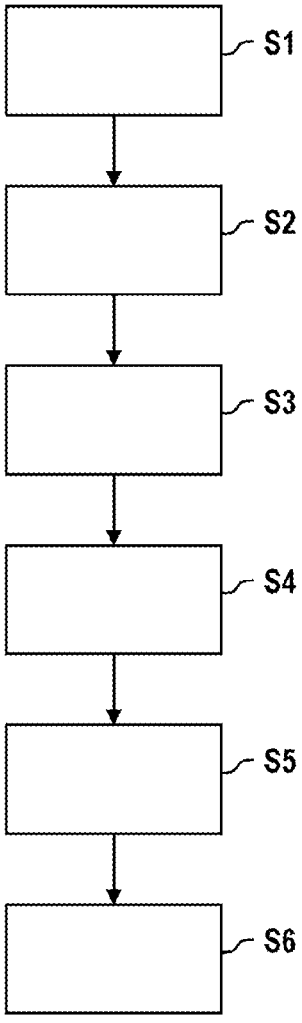
FIG. 10 shows a schematic block diagram of one exemplary embodiment of a method for producing an optical system.

FIG. 10 shows a schematic block diagram of one exemplary embodiment of a method for producing an optical system 100, for example the optical system from FIG. 2, 3, 7 or 8. A first step S1 involves providing a plurality of optical components 101 (see FIG. 2) for guiding radiation in the optical system 100. A second step S2 involves providing a plurality N1 of arrangements 111-114 (see FIG. 2, 3, 7 or 8), where N1≥2, wherein each of the N1 arrangements 111-114 comprises at least one actuator/sensor device 102 (see FIG. 2). A third step S3 involves assigning the actuator/sensor devices 102 of the N1 arrangements 111-114 to the optical components 101. A fourth step S4 involves providing a number N2 of control units 130 (see FIG. 2, 3, 7 or 8) for controlling the number N1 of arrangements 111-114, where N2≥1. A fifth step S5 involves assigning the N1 arrangements 111-114 to the N2 control units 130. A sixth step S6 involves coupling the N1 arrangements 111-114 to the N2 control units 130 in order to transmit electrical signals between the respective control unit 130 and the arrangements 111-114 assigned to the control unit 130, wherein a respective bundle B1-B4 (see FIG. 2, 3, 7 or 8) of electrical lines is used for each of the N1 arrangements 111-114.

Figure 11:
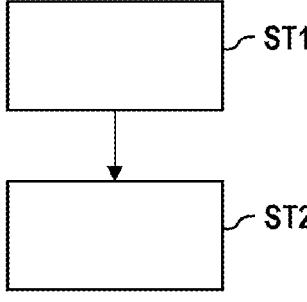
FIG. 11 shows a schematic block diagram of one exemplary embodiment of a method for operating an optical system.

FIG. 11 shows a schematic block diagram of one exemplary embodiment of a method for operating an optical system 100, for example the optical system from FIG. 2, 3, 7, 8 or 9. A first step ST1 involves transmitting a first electrical signal from a control unit 130 to a first arrangement 111 of the plurality N1 of arrangements 111-114 via the interface 140, wherein the first electrical signal is transmitted exclusively via a first bundle B1 of electrical lines of the interface 140. A second step ST2 involves transmitting a second electrical signal from the control unit 130 to a second arrangement 112 of the plurality N1 of arrangements 111-114 via the interface 140, wherein the second electrical signal is transmitted exclusively via a second bundle B2 of electrical lines of the interface 140.

In the case where a defect occurs in the interface, the method additionally comprises detecting an electrical defect in a specific one of the plurality of bundles B1-B4 of electrical lines, interrupting the transmission of the electrical signal via the specific bundle B1-B4 of electrical lines, and continuing the transmission of the respective electrical signals via the plurality of bundles B1-B4 of electrical lines without the specific bundle B1-B4 of electrical lines.

Although the present disclosure has been described on the basis of exemplary embodiments, it is modifiable in diverse ways.

LIST OF REFERENCE SIGNS

1 Projection exposure apparatus
2 Illumination system
3 Light source
4 Illumination optical unit
5 Object field
6 Object plane
7 Reticle
8 Reticle holder
9 Reticle displacement drive

10 Projection optical unit
11 Image field
12 Image plane
13 Wafer
14 Wafer holder
15 Wafer displacement drive
16 Illumination radiation
17 Collector
18 Intermediate focal plane
19 Deflection mirror
20 First facet mirror
21 First facet
22 Second facet mirror
23 Second facet
100 Optical system
101 Optical element
102 Actuator/sensor device
110 Module
111 Arrangement
112 Arrangement
113 Arrangement
114 Arrangement
130 Control unit
130A Control unit
130B Control unit
131 Processing unit
132 Processing unit
140 Interface
140A Portion
140B Portion
150 Central control unit
B1 Bundle
B2 Bundle
B3 Bundle
B4 Bundle
B5 Bundle
B6 Bundle
CB1 Connector
CB1-2 Connector
CB1-4 Connector
CB2 Connector
D Distance
D0 Distance
D1 Distance
DATA0 Data signal line
DATA1 Data signal line
FLB Flexible printed circuit board
L Length
L1 Layer
L2 Layer
L3 Layer
LA Layer
LP Printed circuit board
M1 Mirror
M2 Mirror
M3 Mirror
M4 Mirror
M5 Mirror
M6 Mirror
N Neutral conductor
P Contact pin
V+ Operating voltage line
V− Operating voltage line
S1 Method step
S2 Method step
S3 Method step
S4 Method step

S5 Method step
S6 Method step
ST1 Method step
ST2 Method step

What is claimed is:

1. An optical system, comprising:

a plurality of optical components configured to guide radiation in the optical system;

a plurality of arrangements, each arrangement comprising an actuator/sensor device assigned to one of the optical components;

a plurality of control units configured to control the arrangements, each control unit being assigned at least two of the arrangements; and an interface, wherein for each control unit:

the interface is configured to electrically couple the control unit to the arrangements assigned to the control unit to transmit electrical signals between the control unit and the arrangements assigned to the control unit;

the electrical signals comprise a data signal and/or electrical energy configured to operate an arrangement assigned to the control unit;

the interface comprises a bundle of electrical lines for each of the arrangements assigned to the control unit; and the bundle of electrical lines comprises a number of operating voltage lines and a number of data signal lines, and wherein:

the interface comprises a printed circuit board comprising a plurality of separate electrical planes;

for each bundle of electrical lines, the electrical lines comprise conductor tracks on the printed circuit board, and the bundle of electrical lines is arranged in a respective plane.

2. The optical system of claim 1, wherein, for each control unit, the respective bundle of electrical lines is configured to transmit the electrical signals exclusively from the control unit to the arrangement coupled via the bundle.

3. The optical system of claim 1, wherein the arrangements comprise an identical construction, and, for each control unit, the bundles comprise an identical number of electrical lines for each arrangement assigned to the control unit.

4. The optical system of claim 1, wherein a distance between the conductor tracks of different bundles is greater than a distance between conductor tracks within a bundle.

5. The optical system of claim 1, wherein for each control unit:

the interface comprises a separate plug connector assigned to the control unit;

the separate plug connector is configured to electrically connect the number of electrical lines of the bundle between the control unit and the arrangements assigned to the control unit.

6. The optical system of claim 1, wherein for each control unit:

the interface comprises a common plug connector for a plurality of arrangements assigned to the control unit to electrically connect the electrical lines of the plurality of bundles between the control unit (130, 130A, 130B) and the plurality of arrangements assigned to the control unit;

the common plug connector comprises at least as many contact pins as the number of all the electrical lines comprised by the plurality of bundles; and a distance between each of two adjacent contact pins is greater than a length of a respective contact pin, and/or a pin allocation of the plug connector is such that an unallocated contact pin and/or a contact pin having a neutral reference potential is arranged between two contact pins to which electrical lines of different bundles are assigned.

7. The optical system of claim 1, wherein:

the control units comprise an identical construction;

the optical system comprises at least one central control unit configured to control the control units;

each central control unit is assigned at least two of the control units;

the optical system comprises a further interface configured to electrically couple the respective central control unit to the assigned control units to transmit electrical signals between the respective central control unit and the control units; and the further interface comprises a bundle of electrical lines for each of the control units assigned to the central control unit, the bundle comprising the same number of electrical lines for each of the control units assigned to the central control unit.

8. The optical system of claim 7, wherein the central control unit, the control units and the N1 arrangements are connected in a tree structure.

9. The optical system of claim 1, wherein each actuator/sensor device is configured to: displace the optical component to which it is assigned; and/or determine a position of the optical component to which it is assigned.

10. The optical system of claim 1, wherein:

for each control unit, the respective bundle of electrical lines is configured to transmit the electrical signals exclusively from the control unit to the arrangement coupled via the bundle; and the arrangements comprise an identical construction, and, for each control unit, the bundles comprise an identical number of electrical lines for each arrangement assigned to the control unit.

11. The optical system of claim 1, wherein:

for each control unit, the respective bundle of electrical lines is configured to transmit the electrical signals exclusively from the control unit to the arrangement coupled via the bundle; and a distance between the conductor tracks of different bundles is greater than a distance between conductor tracks within a bundle.

12. The optical system of claim 1, wherein for each control unit:

the respective bundle of electrical lines is configured to transmit the electrical signals exclusively from the control unit to the arrangement coupled via the bundle;

the interface comprises a separate plug connector assigned to the control unit; and the separate plug connector is configured to electrically connect the number of electrical lines of the bundle between the control unit and the arrangements assigned to the control unit.

13. The optical system of claim 1, wherein for each control unit:

the respective bundle of electrical lines is configured to transmit the electrical signals exclusively from the control unit to the arrangement coupled via the bundle;

the interface comprises a common plug connector for a plurality of arrangements assigned to the control unit to electrically connect the electrical lines of the plurality of bundles between the control unit (130, 130A, 130B) and the plurality of arrangements assigned to the control unit;

the common plug connector comprises at least as many contact pins as the number of all the electrical lines comprised by the plurality of bundles; and a distance between each of two adjacent contact pins is greater than a length of a respective contact pin, and/or a pin allocation of the plug connector is such that an unallocated contact pin and/or a contact pin having a neutral reference potential is arranged between two contact pins to which electrical lines of different bundles are assigned.

14. The optical system of claim 1, wherein:

for each control unit, the respective bundle of electrical lines is configured to transmit the electrical signals exclusively from the control unit to the arrangement coupled via the bundle; the control units comprise an identical construction;

the optical system comprises at least one central control unit configured to control the control units;

each central control unit is assigned at least two of the control units;

the optical system comprises a further interface configured to electrically couple the respective central control unit to the assigned control units to transmit electrical signals between the respective central control unit and the control units; and the further interface comprises a bundle of electrical lines for each of the control units assigned to the central control unit, the bundle comprising the same number of electrical lines for each of the control units assigned to the central control unit.

15. The optical system of claim 1, wherein:

for each control unit, the respective bundle of electrical lines is configured to transmit the electrical signals exclusively from the control unit to the arrangement coupled via the bundle; the control units comprise an identical construction; and each actuator/sensor device is configured to: displace the optical component to which it is assigned; and/or determine a position of the optical component to which it is assigned.

16. An apparatus, comprising:

the optical system of claim 1, wherein the apparatus is a lithography apparatus.

17. The apparatus of claim 16, wherein the apparatus is an EUV lithography apparatus.

18. The apparatus of claim 16, wherein the apparatus comprises a projection optical unit, and the projection optical unit comprises the optical system.

19. A method, comprising:

providing an optical system according to claim 1;

transmitting a first electrical signal from a control unit to a first arrangement of the plurality of arrangements via the interface, the first electrical signal being transmitted exclusively via a first bundle of electrical lines of the interface; and transmitting a second electrical signal from the control unit to a second arrangement of the plurality of arrangements via the interface, the second electrical signal being transmitted exclusively via a second bundle of electrical lines of the interface, wherein transmitting an electrical signal via a bundle of electrical lines comprises:

detecting an electrical defect in a specific one of the plurality of bundles of electrical lines;

interrupting the transmission of the electrical signal via the specific bundle of electrical lines; and continuing the transmission of the respective electrical signals via the plurality of bundles of electrical lines without the specific bundle of electrical lines.

* * * * *